US007741682B2

(12) United States Patent
Sukekawa

(10) Patent No.: US 7,741,682 B2
(45) Date of Patent: Jun. 22, 2010

(54) SEMICONDUCTOR INTEGRATED CIRCUIT DEVICE INCLUDING A SILICON LAYER FORMED ON A DIFFUSION LAYER

(75) Inventor: Mitsunari Sukekawa, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 341 days.

(21) Appl. No.: 11/520,749

(22) Filed: Sep. 14, 2006

(65) Prior Publication Data

US 2007/0059888 A1 Mar. 15, 2007

(30) Foreign Application Priority Data

Sep. 15, 2005 (JP) ............................ 2005-268727
Aug. 22, 2006 (JP) ............................ 2006-225603

(51) Int. Cl.
*H01L 29/78* (2006.01)

(52) U.S. Cl. ....................... 257/382; 257/385; 257/412; 257/758; 257/760; 257/E27.06

(58) Field of Classification Search ................. 257/382, 257/368, 213, 412, 385, 758, 760, E27.06; 438/279
See application file for complete search history.

(56) References Cited

U.S. PATENT DOCUMENTS 5,909,059 A * 6/1999 Hada et al. .................. 257/750
6,426,524 B1 * 7/2002 Lam et al. .................. 257/296
6,472,303 B1 * 10/2002 Weon et al. ................. 438/597
6,635,576 B1 * 10/2003 Liu et al. .................... 438/700
6,808,951 B2 * 10/2004 Ikeda et al. .................. 438/41
6,914,309 B2 7/2005 Koga
7,052,983 B2 * 5/2006 Park et al. .................. 438/607

(Continued)

FOREIGN PATENT DOCUMENTS

JP 9-50986 2/1997

(Continued)

OTHER PUBLICATIONS

Japanese Office Action dated May 14, 2008 with Partial English Translation.

*Primary Examiner*—Thanh V Pham
*Assistant Examiner*—Duy T Nguyen
(74) *Attorney, Agent, or Firm*—McGinn IP Law Group, PLLC

(57) ABSTRACT

A semiconductor integrated circuit device having a pair of adjacent MOS transistors and a contact plug 33, buried into a contact hole formed by a self-aligned contact process using a silicon nitride film as an etching stopper and electrically connected to diffusion layers 2 and 3 constituting the MOS transistor on a silicon substrate 21 surrounded by a device isolation region 4: wherein a silicon layer 28 is formed on the exposed surface of the diffusion layers 2 and 3 by selective epitaxial growth, which is in contact with an end of each gate insulation film 22 on the diffusion layer side; an insulation film 27' composed of a silicon oxynitride film or a silicon oxide film is buried between the each gate electrode and the silicon layer 28 while being in contact with the gate insulation film 22; and the silicon nitride films 26, 29', and 32 are isolated from the silicon substrate 21 by the insulation film 27'.

16 Claims, 9 Drawing Sheets

32
33
29'
30
24(1a)
29
25
26
24(1d)
23
27'
4
4
2
21
3
22
28
2
24(1b)
23
24(1c)

U.S. PATENT DOCUMENTS

| | | | | |
|---|---|---|---|---|
| 2002/0050644 | A1* | 5/2002 | Matsumoto et al. | 257/751 |
| 2003/0082900 | A1* | 5/2003 | Peng et al. | 438/618 |
| 2003/0143790 | A1* | 7/2003 | Wu | 438/197 |
| 2003/0216004 | A1* | 11/2003 | Jeong et al. | 438/279 |
| 2003/0216030 | A1* | 11/2003 | Kim et al. | 438/629 |
| 2004/0056312 | A1* | 3/2004 | Asada et al. | 257/368 |
| 2005/0087880 | A1* | 4/2005 | Kujirai et al. | 257/758 |
| 2005/0095793 | A1* | 5/2005 | Lee | 438/294 |
| 2005/0176213 | A1* | 8/2005 | Chen et al. | 438/398 |
| 2005/0245073 | A1* | 11/2005 | Lee et al. | 438/629 |
| 2006/0003530 | A1* | 1/2006 | Kim et al. | 438/258 |
| 2006/0240655 | A1* | 10/2006 | Lee | 438/590 |

FOREIGN PATENT DOCUMENTS

| | | |
|---|---|---|
| JP | 11-307759 | 11/1999 |
| JP | 2002-319551 | 10/2002 |
| JP | 2003-100769 | 4/2003 |
| JP | 2003-338542 | 11/2003 |

* cited by examiner

PRIOR ART

PRIOR ART

PRIOR ART

SEMICONDUCTOR INTEGRATED CIRCUIT DEVICE INCLUDING A SILICON LAYER FORMED ON A DIFFUSION LAYER

BACKGROUND OF THE INVENTION

1. Field of the Invention

The present invention relates to a semiconductor integrated circuit device and a manufacturing method thereof, and particularly to the semiconductor integrated circuit device having a self-aligned contact structure and the manufacturing method thereof.

2. Related Art

Miniaturization of wirings has been progressed in order to improve characteristics and yield of semiconductor integrated circuit devices. In a manufacture process of the miniaturized semiconductor integrated circuit device, the problem arises that a design size of a contact hole (=hole diameter+design margin) becomes too large when the design margin of the contact hole is determined in consideration of variation in alignment with an under layer wiring. The variation in the alignment results from insufficient alignment performance of a reduction projection exposure apparatus used in the photolithography. Moreover, the variation is particularly difficult to be scaled down among various scaling factors involved in a semiconductor process, and is even said to affect determination on limitation of the exposure technology more than resolution.

For this reason, a self-aligned contact (SAC) process has been used principally in recent years wherein the design margin for the alignment can be made unnecessary on a photomask.

Hereinbelow, the SAC process using a nitride film sidewall as an etching stopper is described by reference to the drawings. FIG. 7 is a schematic cross sectional view of steps illustrating the SAC process disclosed in Japanese Patent Laid-Open No. 9-050986 (Patent Document 1).

In the SAC process of FIG. 7, a gate insulation film 102 is formed on the surface of a silicon substrate 101, and then gate electrodes 103 are formed thereon. Here, the gate electrode 103 is constituted of tungsten polycide. On the gate electrode 103, offset oxide films 104 are formed. Then, first sidewall insulation films 105 are formed on both sides of each gate electrode 103 and offset oxide film 104. Here, the offset oxide film 104 and the first sidewall insulation film 105 are constituted of an SiOx film (here, the SiOx film is a silicon oxide film).

Subsequently, source/drain diffusion layers 106 with an LDD structure are formed, followed by stacking an SiN etching stopper film 107 and an interlayer insulation film 108 thereon. The SiN etching stopper film 107 is a silicon nitride film of approximately 50 nm in thickness formed by the Low Pressure Chemical Vapor Deposition (LP-CVD) method. The interlayer insulation film 108 is the SiOx film.

Next, a resist mask 109 is formed (FIG. 7(A)), and the interlayer insulation film 108 is selectively dry-etched by using the resist mask 109 to form a contact hole 110. Here, the SiN etching stopper film 107 serves as an etching stopper which protects the offset oxide film 104 and the first sidewall insulation film 105 from the dry etching (FIG. 7(B)).

Then, an etching gas for the dry etching is changed to selectively etch back the SiN etching stopper film 107, and a contact hole 110*a* which exposes the surface of the silicon substrate 101 is formed. On the exposed surface of the contact hole 110*a*, the SiN etching stopper film 107 is etched back which partially remains on the side face of the first sidewall insulation film 105 to form a second sidewall insulation film 107*a*. A wiring 111 is formed which connects to the source/drain diffusion layer 106 via the contact hole 110*a* formed in this manner (FIG. 7(C)). Here, the wiring 111 is a publicly known stacked wiring.

As the semiconductor device becomes still more miniaturized, the SAC technique is used abundantly while the miniaturization of the SAC structure becomes indispensable. Particularly, in the case of a Dynamic Random Access Memory (DRAM) where the contact hole is formed by the SAC process which connects a diffusion layer of a memory cell section constituted of one capacitor and one MOS transistor with a bit line, the SAC structure must be miniaturized even further.

Next, the miniaturization of the above described SAC structure is described. FIG. 8 is a schematic cross sectional view in the order of manufacturing steps of the SAC disclosed in Japanese Patent Laid-Open No. 2002-319551 (Patent Document 2).

As illustrated in FIG. 8(A), gate insulation films 202 and 202*a* are formed on the surface of a silicon substrate 201, and then gate electrodes 203 and 203*a* are formed thereon, respectively. Here, the gate electrodes 203 and 203*a* have a polycide structure such as a WSi layer/a polycrystalline silicon layer. On the gate electrodes 203 and 203*a*, protective insulation films 204 and 204*a* are formed. Here, the protective insulation films 204 and 204*a* are silicon nitride films. Then, source/drain diffusion layers 205 and 205*a* are formed.

Subsequently, as illustrated in FIG. 8(B), a blanket insulation film 206 is formed on the whole surface. The blanket insulation film 206 is a silicon nitride film with approximately 30 nm in thickness, depositing on the surfaces of the gate electrodes 203 and 203*a*, the protective insulation films 204 and 204*a*, and the source/drain diffusion layers 205 and 205*a*. Here, the major difference with the case of FIG. 7 is that there is no sidewall insulation film on the side face of the gate electrode or the like.

Next, an interlayer insulation film 207 is stacked on the blanket insulation film 206. Here, the interlayer insulation film 207 is a silicon oxide film planarized by the Chemical Mechanical Polishing (CMP) method.

Next, although not illustrated, a resist mask is provided, which is used as the etching mask to dry-etch the interlayer insulation film 207. The dry etching in this case is performed by Reactive Ion Etching (RIE) apparatus which uses two radio frequencies (RF). Here, plasma excitation of an etching gas is carried out by the RF of 13.56 MHz to 60 MHz. The RF of around 1 MHz is then added. In this conventional art, nitrogen ($N_2$) is added to a mixed gas of $C_5F_8$ and $O_2$ as the etching gas in such 2 RF RIE. An argon (Ar) gas is then added to the mixed gas to carry out the plasma excitation. With such an etching gas, the etch rate of the protective insulation layers 204 and 204*a* or the blanket insulation film 206 under the interlayer insulation film 207 is reduced substantially. In other words, the ratio of the etch rate of the silicon nitride film ($Si_3N_4$) to the etch rate of the silicon oxide ($SiO_2$) film can be reduced under a high controllability. Thus, the etching of the blanket insulation film 206 or the protective insulation layers 204 and 204*a* would hardly take place at the RIE step of the interlayer insulation film 207.

Subsequently, the etching gas is changed to the mixed gas of $CHF_3$ and CO to perform the 2 RF RIE, so that the blanket insulation film 206 on the bottom is removed to expose the surface of the diffusion layer 205. In this manner, the blanket insulation film 206*a* is left on the sidewalls of the gate electrodes 203 and 203*a* and the protective insulation layers 204 and 204*a* as illustrated in FIG. 8(C). Here, the film thickness of the remaining blanket insulation film 206*a* is approximately 25 nm. Thus, as illustrated in FIG. 8(C), a contact hole 208 is formed which reaches the surface of the diffusion layer 205.

Thereafter, although not illustrated, a contact plug is formed in the above described contact hole 208, and the bit line connected to the contact plug is allocated thereon.

As the miniaturization of the contact hole progresses with the above described technique and thus resistance of the contact plug increases, it is concerned that a signal transmission rate would become slow. As what improves this point, a landing plug contact is disclosed in Japanese Patent Laid-Open No. 2003-338542 (Patent Document 3) which is a kind of the SAC process of forming plug polysilicon in portions of a bit line contact and of a charge storage electrode contact after forming a word line.

Hereinbelow, the method of forming the contact plug disclosed in Japanese Patent Laid-Open No. 2003-338542 is described by reference to FIG. 9. The steps through forming the contact hole are similar to those of the conventional art.

As illustrated in FIG. 9(A), on a substrate 300, a transistor provided with a gate insulation film 301, a gate electrode 302, and a source/drain junction 305 is formed, and an interlayer insulation film 306 is then formed. A capping insulation film 303 is formed over the gate electrode 302, while a spacer insulation film 304 is formed at the side thereof.

The spacer insulation film 304 is formed at the side of the gate electrode by forming the silicon nitride film or the like on the semiconductor substrate comprising the gate electrode 302 and by performing etch-back the whole surface. In this case, however, upon etching back the whole surface for forming the spacer, over-etching of approximately 30% is performed preferably so as to ensure that the surface of the semiconductor substrate 300 is exposed.

The gate electrode 302 has also a typical structure constituted with a conductive body made with a polysilicon layer or stacked polysilicon layers, a diffusion barrier and so forth. Moreover, various types of the oxide films are used for the interlayer insulation film 306, e.g., boro phospho silicate glass (BPSG), spin on glass (SOG), undoped silicate glass (USG), phospho silicate glass (PSG) and so on. After forming the interlayer insulation film 306 in this manner, a CMP process or a flow process to the interlayer insulation film 306 is performed to planarize a surface of the inter-layer insulating layer 306.

Next, a landing plug contact hole is formed by performing the etching step utilizing a contact mask (not illustrated) and a native oxidation film formed in the contact hole is removed through the washing step. For the etching process for forming the contact hole, the etching is overly carried out exceeding in approximately 30% more than a regular etching to form firmly the contact hole so as to expose the substrate 300.

After the etching step for forming the contact hole, the washing step for removing the native oxidation film is performed in the method disclosed in this conventional art in which an in situ washing step such as hydrogen baking or a rapid heat treatment is not performed but only the general washing step is performed. In other words, the natural oxidation film inside the contact hole is removed by the general washing step utilizing a BOE (Buffered Oxide Etchant), an HF (Hydrogen Fluoride) solution, or an HF gas. A wafer with which the etching step and the washing step are performed as described above moves into a high vacuum system for being used in the following step. In this case, if the wafer is set so as to move into the high vacuum system within approximately two hours after the washing step, growth of the native oxidation film would be negligible.

Next, as illustrated in FIG. 9(B), single crystal silicon 308 is grown epitaxially on the bottom of the contact hole using the high vacuum system. While the single crystal silicon 308 is grown epitaxially on the bottom of the contact hole because it is the portion to contact with the silicon substrate 300, polysilicon 309, not the single crystal silicon, is formed at the sidewall portion of the contact hole because the portion contacts with the spacer insulation film 304 constituted of the nitride film or the like and the interlayer insulation film 306 constituted of the oxide film or the like.

The reason for using the high vacuum system is that it restrains growth of the native oxidation film and the single crystal silicon is readily grown epitaxially in the state with few impurities when the environment in a reaction chamber is high vacuum. In the method disclosed in this conventional art, the high vacuum state is utilized where the pressure in the reaction chamber is approximately $10^{-7}$ Pa to $10^{-4}$ Pa ($10^{-9}$ to $10^{-6}$ Torr).

The epitaxially grown single crystal silicon 308 is grown epitaxially using the gas comprising Si, such as monosilane ($SiH_4$) or disilane ($Si_2H_6$), as a source gas at a temperature of 550 to 800° C. so as to have the thickness of 5 to 20 nm from the bottom of the contact hole 307. The epitaxially grown single crystal silicon 308 may be used while undoped, or it may be doped with impurities such as phosphate (P) using a $PH_3$ gas diluted with an inert gas such as He, $N_2$, or Ar as a dopant gas.

The single crystal silicon 308 is grown epitaxially on the bottom of the contact hole 307 which contacts with the semiconductor substrate 300, while, at the sidewall of the contact hole, polysilicon 309 is formed with a predetermined thickness and then a polysilicon film 310 is deposited using a conventional batch type device, as illustrated in FIG. 9(C), to embed the contact hole 307. In depositing the polysilicon film 310 utilizing the conventional batch type device, the polysilicon film having the thickness of 150 to 300 nm is formed using the gas comprising silicon as the source gas at the temperature of 480 to 620° C. and a pressure of 26.7 to 200 Pa (0.2 to 1.5 Torr).

Thereafter, in order to reduce the resistance of a polysilicon plug, a subsequent doping step is performed wherein the $PH_3$ gas diluted with the inert gas, such as He, $N_2$, or Ar, is used as the dopant gas so that phosphorus (P) concentration may be set to $1.0\times10^{20}$ to $3.0\times10^{20}$ atoms/$cm^3$. In this manner, the polysilicon film 310 is deposited over a whole structure comprising an upper portion of the interlayer insulation film 306 and an inner portion of the contact hole, followed by performing the CMP or etching back the whole surface until the surface of the interlayer insulation film 306 is exposed, to complete a contact plug 311 as illustrated in FIG. 9(D). When performing the CMP, slurry such as silica, alumina, or ceria with a particle size of 50 to 300 nm is used at pH 6 to 11.

However, in the SAC process disclosed in these conventional arts, there is the problem that a gate threshold voltage varies because hot electrons generated at the end of the gate electrode are trapped at the interface of the silicon nitride film due to the presence of the silicon nitride film at the end of the gate electrode. In order to avoid this problem, the technique is disclosed in Japanese Patent Laid-Open No. 11-307759 (Patent Document 4) which uses an LDD sidewall stacked of a TEOS-NSG film and the silicon nitride film.

Hereinbelow, an LDD sidewall formation method disclosed in Japanese Patent Laid-Open No. 11-307759 is described by reference to FIG. 10.

A gate oxide film 402*a* is formed on a silicon substrate 401 at 4 nm in thickness by the thermal oxidation, and subsequently gate polysilicon 403*a* is deposited thereon at 150 nm in thickness by the CVD.

The gate oxide film 402*a* and the gate polysilicon 403*a* are patterned in the form of the gate electrode by the lithography and dry etching, as illustrated in FIG. 10(B), to form a gate insulation film 402 and a gate electrode 403, respectively.

Then, as illustrated in FIG. 10(C), arsenic ions (As+) are implanted in the surface of the silicon substrate 401 using the gate electrode 403 as a mask under the condition of a dose amount of $2.5\times10^{13}$ $cm^{-2}$ and an implantation energy of 30 keV to form a shallow impurities implantation region 404.

As illustrated in FIG. 10(D), tetraethyl orthosilicate (TEOS) is supplied on the substrate surface at 300 sccm by the LP-CVD method to form a TEOS-NSG (non-doped silicate glass) film 405 at 10 to 20 nm in thickness under the condition of a degree of vacuum of 133 Pa (1 Torr) and a substrate temperature of 600 to 700° C. Then, dichlorosilane ($SiH_2Cl_2$) and ammonia ($NH_3$) are supplied at 60 sccm and 600 sccm, respectively, using the LP-CVD method to form a silicon nitride film 406 at 80 to 90 nm in thickness under the condition of the degree of vacuum of 33.3 Pa (0.25 Torr) and the temperature of 700 to 800° C.

A stacked structure of the TEOS-NSG film 405 and the silicon nitride film 406 is dry-etched to form a sidewall insulation film 407 with a two-layer structure of the TEOS-NSG film 405 and the silicon nitride film 406 as illustrated in FIG. 10(E).

Next, as illustrated in FIG. 10(F), the arsenic ions (As+) are implanted into a deep region of the substrate surface using the gate electrode 403 and the sidewall insulation film 407 as the mask under the condition of the dose amount of $2.5\times10^{15}$ $cm^{-2}$ and the implantation energy of 50 keV and then thermal annealing is performed to form a source/drain region 408 with the LDD structure.

Subsequently, a titanium film is formed on the substrate surface and unreacted titanium is removed after a heat treatment to form a titanium silicide layer 409 on the surface of the source/drain region 408 and the surface of the gate electrode 403.

In the SAC process disclosed in Patent Documents 1 to 3, it is required to use the silicon nitride film which serves as the etching stopper to form the contact hole. For this reason, the gate threshold voltage may vary because the silicon nitride film is present between the gate electrode and the contact plug resulting in the silicon nitride film being adjacent to the semiconductor substrate so that electrons of a channel formed on the surface of the semiconductor substrate are trapped under the sidewall of the silicon nitride film.

In addition, where the LDD sidewall is the stacked structure as in Patent Document 4, the contact hole has to be formed while the sidewall has been formed. Consequently, in a DRAM semiconductor memory, a space between the gates becomes narrow while a planar area allowed for the contact hole decreases as the miniaturization progressing, resulting in the dry etching processing being very difficult. Moreover, in the DRAM process, it is required to form the silicon nitride film for substrate antioxidation between the contacts, leading to the problem that the space between the contacts further becomes narrower disabling to respond to the miniaturization.

SUMMARY OF THE INVENTION

In view of the above mentioned problems, an object of the present invention is to provide a semiconductor integrated circuit device in which a silicon nitride film is not adjacent to a semiconductor substrate and a manufacturing method of the semiconductor integrated circuit device which facilitates dry etching processing of a contact hole.

In order to achieve the above mentioned object, the semiconductor integrated circuit device of the present invention is related to a semiconductor integrated circuit device comprising, on a silicon substrate surrounded by a device isolation region, a pair of adjacent MOS transistors and a contact plug, buried into a contact hole formed by a self-aligned contact process using a silicon nitride film as an etching stopper and electrically connected to a diffusion layer constituting the MOS transistor:

wherein gate insulation films of the pair of MOS transistors is isolated to constitute an exposed surface of the diffusion layer;

the device has a silicon layer formed on the exposed surface of the diffusion layer by selective epitaxial growth, which is in contact with an end of each gate insulation film on the diffusion layer side;

the contact plug is electrically connected to the diffusion layer via the silicon layer;

each gate electrode of the pair of MOS transistors is formed while being retracted from both ends of each gate insulation film and has a gap between the each gate electrode and the silicon layer; and an insulation film composed of a silicon oxynitride film or a silicon oxide film is buried in the gap while being in contact with the gate insulation film, and the insulation film isolates at least the silicon nitride film used as the etching stopper in the self-aligned contact process and the silicon substrate.

In addition, the present invention provides a manufacturing method of a semiconductor integrated circuit device comprising, on a silicon substrate surrounded by a device isolation region, a pair of adjacent MOS transistors and a contact plug electrically connected to a diffusion layer constituting the MOS transistor, which comprises the steps of:

forming a sidewall insulation film of a gate electrode by an insulation film composed of at least a silicon oxynitride film or a silicon oxide film;

removing a gate insulation film using the sidewall insulation film as a mask to expose the surface of the silicon substrate on which the diffusion layer is formed;

growing a silicon layer by selective epitaxial growth on the exposed surface of the diffusion layer; removing the sidewall insulation film by isotropic etching to leave a portion of the sidewall insulation film selectively in a gap between the silicon layer and the gate electrode; forming a third silicon nitride film and an interlayer insulation film on the whole surface;

etching the interlayer insulation film with the third silicon nitride film as an etching stopper using a mask which opens a position where a contact hole is to be formed of the interlayer insulation film and further etching back the third silicon nitride film to form a contact hole which exposes the silicon layer; and forming a contact plug by burying a conductive material in the contact hole.

The present invention has the effect to inhibit the variation of the gate threshold voltage due to a hot carrier being trapped because the silicon nitride film which traps the hot carrier in the vicinity of the channel under the gate is isolated from the silicon substrate even when the contact hole is formed by the SAC process which uses the silicon nitride film as the etching stopper.

Moreover, since the silicon oxynitride film or the silicon oxide film having a low relative dielectric constant compared with that of the silicon nitride film is present in the gap between the silicon layer accumulated by the selective epitaxial growth method and the gate electrode, the parasitic capacitance between the silicon layer and the gate electrode can be reduced and, particularly in the DRAM semiconductor memory, the capacitance between the bit line and the word line can be reduced, resulting in reading operation of the memory being stabilized.

Furthermore, since the sidewall insulation film composed of the silicon oxynitride film or the silicon oxide film formed on a portion other than the gap between the silicon layer and the polysilicon layer of the gate electrode is removed after the silicon layer is formed by the selective epitaxial growth, the interval between the adjacent gate electrodes is widened, resulting in the dry etching processing upon forming the contact hole being facilitated.

DETAILED DESCRIPTION OF THE PREFERRED EMBODIMENTS

Figure 1:
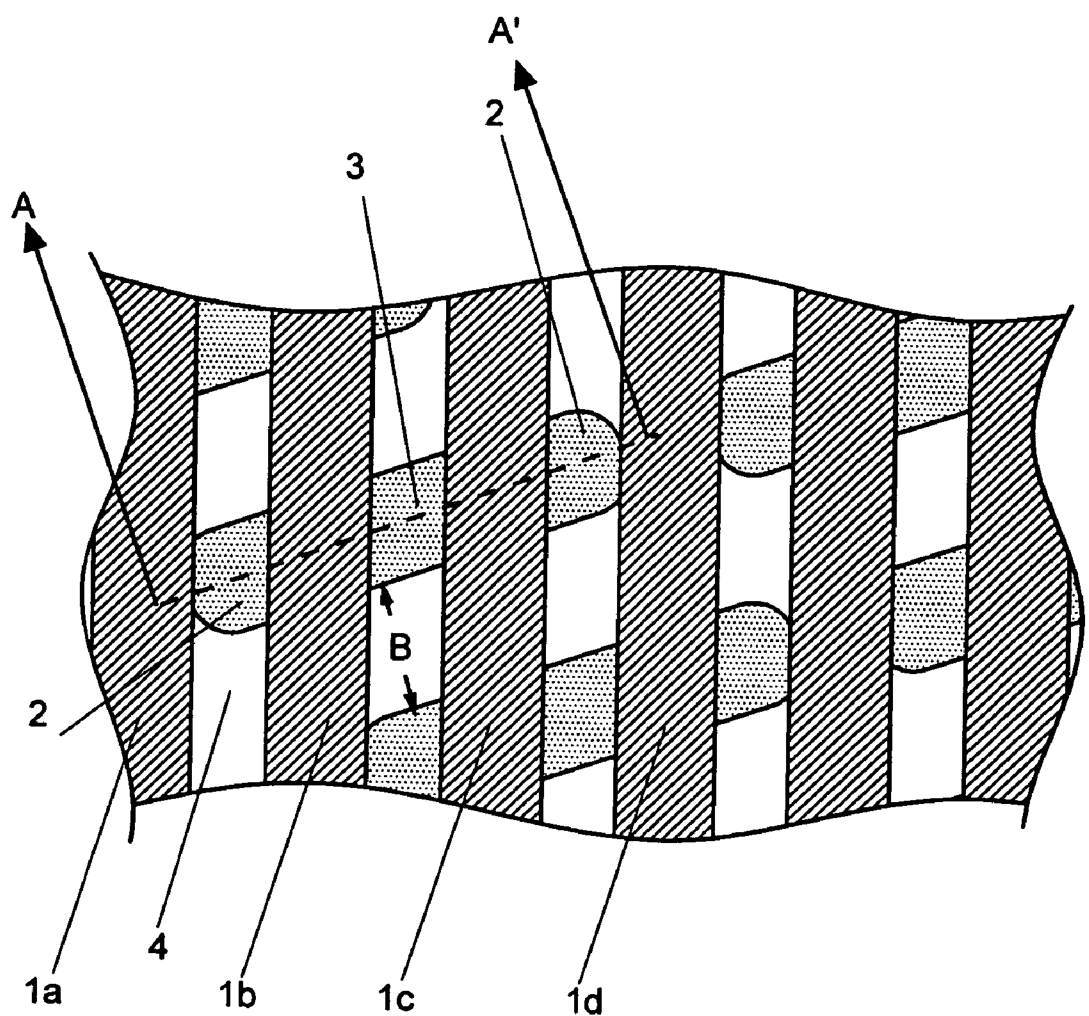
FIG. 1 is a layout of a DRAM semiconductor memory as an embodiment of the present invention.
Figure 4:
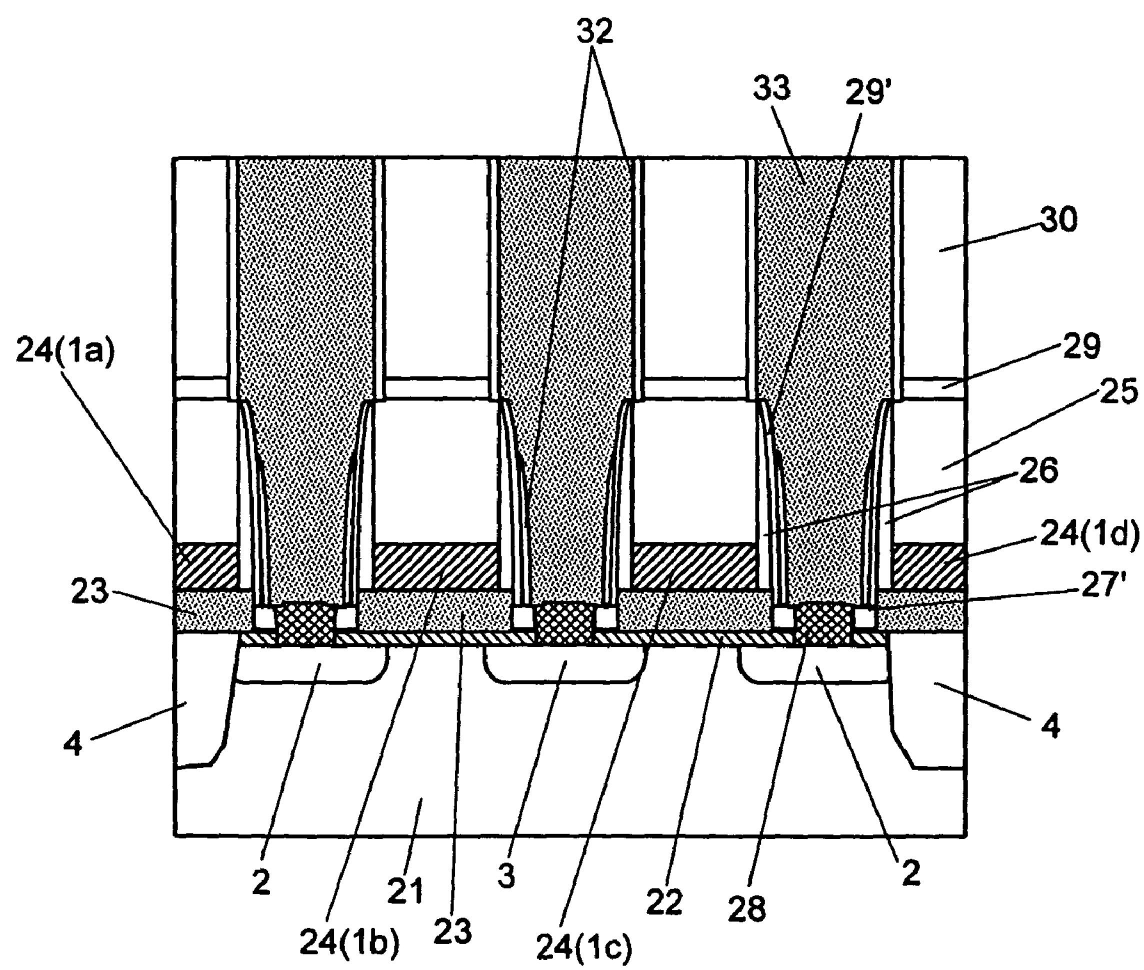
FIG. 4 is a schematic cross sectional view of the DRAM semiconductor memory as the embodiment of the present invention corresponding to the line A-A" of FIG. 1.

FIG. 1 illustrates a memory cell layout of a DRAM as an embodiment of the present invention. Word lines 1*a*, 1*b*, 1*c*, and 1*d*, a capacitance contact side diffusion layer 2, a bit line contact side diffusion layer 3, and a device isolation region 4 are illustrated, respectively. A pair of MOS transistors are formed on a silicon substrate surrounded by the device isolation region 4, and the word lines 1*b* and 1*c* corresponding to the pair of the MOS transistors are constituted of a gate electrode of the MOS transistor. While two diffusion layers for a source and a drain are required in order to constitute the MOS transistor, a source diffusion layer is shared as the bit line contact side diffusion layer 3 and a drain diffusion layer is divided on both sides thereof as the capacitance contact side diffusion layer 2 in the memory cell of the DRAM illustrated in FIG. 1. FIG. 4 is a cross sectional view taken along the line A-A' of FIG. 1.

As illustrated in the cross sectional view of FIG. 4, a metal film 24 which constitutes the gate electrode of the MOS transistor is used as wiring, i.e., the word lines 1*b* and 1*c*. On each of the diffusion layers 2 and 3, there is provided a silicon layer 28 formed by the selective epitaxial growth method.

A gate insulation film 22 is formed on a silicon substrate 21, and in the case of the gate electrode of the MOS transistor, a polysilicon film 23 retracted from the both ends of the gate insulation film 22 is formed thereon and a metal film 24 retracted from the both ends of the polysilicon film 23 is further formed thereon so that the polysilicon film 23 and the metal film 24 constitute a stacked structure of the gate electrode. On the metal film 24, a first silicon nitride film 25 is stacked which is to be the mask upon patterning the underlayer polysilicon film 23.

The gate insulation film 22 utilizes the silicon oxide film formed by the thermal oxidation method. Alternatively, it may utilize a silicon oxynitride film formed by carrying out nitride processing of the silicon oxide film formed by the thermal oxidation method.

The gate electrode has a so-called polymetal structure wherein the metal film 24 is stacked on the polysilicon film 23. In the case of the polymetal structure, a nitride or a silicide film of a metal constituting the metal film 24 may be formed between the polysilicon film 23 and the metal film 24 in order to reduce interface resistance between the polysilicon film 23 and the metal film 24. However, this embodiment is described applying the stacked structure of the polysilicon film 23 and the metal film 24 for simplicity of description. As the metal film 24, a high melting point metal, such as tungsten, nickel, and molybdenum, can be used.

A first sidewall silicon nitride film 26 composed of a second silicon nitride film and a second sidewall silicon nitride film 29' composed of a third silicon nitride film are provided on the side faces of the stack of the first silicon nitride film 25 and the metal film 24, while an insulation film 27' (hereinafter, referred to as a gap insulation film) composed of the silicon oxynitride film is provided on the side face of the polysilicon film 23 so as to fill a gap between the polysilicon film 23 and the silicon layer 28. The second sidewall silicon nitride film 29' is formed by etching back a third silicon nitride film 29 serving as the etching stopper upon forming the contact hole by the SAC process. In the present invention, the second sidewall silicon nitride film 29' is isolated from at least the silicon substrate 21 by the gap insulation film 27'.

The contact hole is provided in an interlayer insulation film 30 covering the whole surface so that the surface of the silicon layer 28 is exposed, and doped polysilicon 33 which is to be the contact plug is buried therein followed by forming a contact sidewall protection silicon nitride film 32.

The thickness (height in FIG. 4) of the silicon layer 28 is thicker than the thickness of the sidewall insulation film 27 composed of the silicon oxynitride film at the contact surface with the gate insulation film 22 (substantially equivalent to a film deposition thickness of the silicon oxynitride film), and it can be adjusted within a range thinner than a half of an interval B between the adjacent silicon substrates separated by the device isolating insulation film 4 illustrated in FIG. 1. If the thickness of the silicon layer 28 is thinner than the thickness described above of the sidewall insulation film 27 composed of the silicon oxynitride film, the gap insulation film 27' cannot remain in the gap between the polysilicon film 23 and the silicon layer 28. In contrast, if the thickness of the silicon layer 28 is thicker than the half of the interval B between the adjacent silicon substrates of the device isolating insulation film 4 illustrated in FIG. 1, the silicon layers 28 grown by the selective epitaxial growth in the transverse direction (the vertical direction of the paper in FIG. 1) from the respective silicon substrates come into contact with each other, prohibiting the isolation therebetween.

For example, in the design rule where the minimum processing size is set to 90 nm, the interval B between the adjacent silicon substrates illustrated in FIG. 1 is set to 90 nm as well. In this case, the silicon layers 28 will contact with each other when they grow by 45 nm respectively in the transverse direction from the ends of the respective silicon substrates, resulting in the isolation of the silicon substrates from each other becoming difficult. Meanwhile, in order to ensure the isolation between the polysilicon film 23 and the silicon layer 28, it is desirable to separate them by 10 nm or more, preferably by 15 nm or more, and to have the gap insulation film 27' in the gap. In addition, in order to have the gap insulation film 27' remain between the polysilicon film 23 and the silicon layer 28, it is required to make the thickness of the silicon layer 28 thicker than the thickness of the sidewall insulation film 27 at the contact surface with the gate insulation film 22. Therefore, in this case, the thickness of the silicon layer 28 is preferably 40 nm or less, which is thinner than the half of the interval B between the adjacent silicon substrates, and desirably 15 nm or more, more preferably 20 nm or more, which is thicker than the thickness of the sidewall insulation film 27 at the contact surface with the gate insulation film 22. The thickness described above of the sidewall insulation film 27 is obviously made thinner than the upper limit of the thickness of the silicon layer 28, the thickness being less than 40 nm, preferably 30 nm or less in the case described above.

In this embodiment, the end of the gate insulation film 22 is in contact with the silicon layer 28 formed on the surface of the silicon substrate while the gap between the polysilicon film 23 and the silicon layer 28 is constituted of the gap insulation film 27' composed of the silicon oxynitride film, so that hot electrons generated at the end of the gate would not be trapped at the interface of the nitride films (26, 29'). As the gap insulation film 27', the silicon oxide film (for example, a BPSG film, a PSG film, a BSG film, or an NSG film) may be utilized instead of the silicon oxynitride film.

Although this embodiment illustrates the example where contact plugs are formed in the capacitance contact side diffusion layer 2 and the bit line contact side diffusion layer 3 simultaneously, they may be formed respectively or may be formed only on the bit line contact side diffusion layer 3 by applying this embodiment.

While a manufacturing method of a self-aligned contact of the present invention will be described hereinbelow by taking a manufacturing method of the DRAM illustrated in FIG. 4 as an example by reference to FIGS. 2 and 3, the present invention is not limited only to this example.

FIRST EXAMPLE

FIGS. 2 and 3 are schematic cross sectional views of steps illustrating a manufacturing process of the example.

Figure 2A:
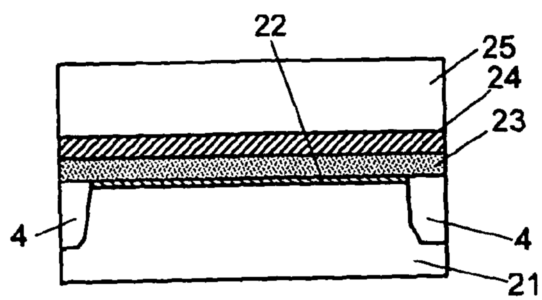
FIGS. 2(A) to 2(F) are schematic cross sectional views of steps illustrating a manufacture example of the DRAM semiconductor memory as the embodiment of the present invention.

After forming the device isolation region 4 in the silicon substrate 21, the silicon oxide film serving as the gate insulation film 22 with the thickness of 7 nm using the thermal oxidation method, the polysilicon film 23 with the thickness of 70 nm, the metal film 24 composed of a tungsten film with the thickness of 60 nm, and the first silicon nitride film 25 with the thickness of 200 nm were formed using such as the CVD method and the spatter method in this order (FIG. 2(A)).

Figure 2B:
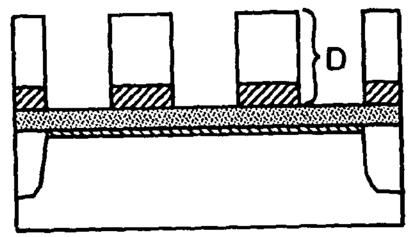
Figure 2C:
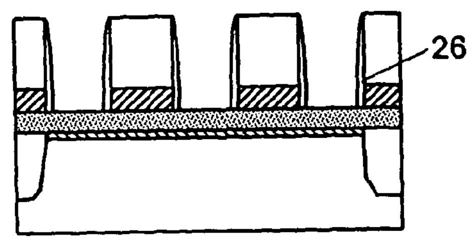
Figure 2D:
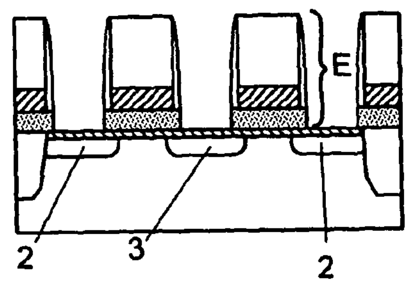
Figure 2E:
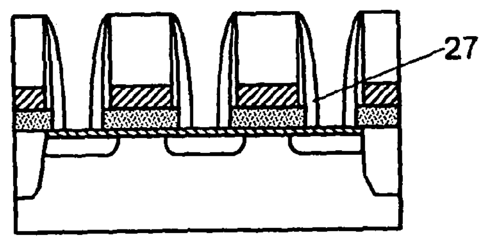

Next, using the general lithography technique, the first silicon nitride film 25 and the metal film 24 were etched into a first gate form using the general dry etching method with the photoresist as the mask to form a stack D (FIG. 2(B)). Thereafter, the second silicon nitride film with the thickness of 2 nm was formed and etched back using an anisotropic dry etching method to form the first sidewall silicon nitride film 26 at both sides of the stack D (FIG. 2(C)).

Subsequently, the polysilicon film 23 was removed by the etching using the stack D with the first sidewall silicon nitride film 26 formed thereon as the mask to form a stack E, wherein the side from the first sidewall silicon nitride film to the polysilicon film 23 constituted substantially planar. Then, the diffusion layers 2 and 3 were formed through the ion implantation and diffusion steps which are not illustrated (FIG. 2(D)). Thereafter, the silicon oxynitride film with the thickness of 20 nm was formed and etched back using the anisotropic dry etching method to form the sidewall insulation film 27 which covered a sidewall portion of the stack E (FIG. 2(E)).

The silicon oxynitride film was formed using a low pressure thermal CVD system with dichlorosilane, ammonia, and dinitrogen monoxide as a source gas under the condition of 680° C. and 133 Pa (1 Torr). At this time, the silicon oxynitride film contained silicon (Si), oxygen (o), and nitrogen (N) at a ratio of Si:O:N=4:3.5:2.5.

The dry etching of the silicon oxynitride film was performed under the etching condition of the pressure of 20 Pa (150 mTorr), the RF frequency of 13.56 MHz, RF power of 500 W, and $CF_4$ gas at 70 sccm.

Figure 2F:
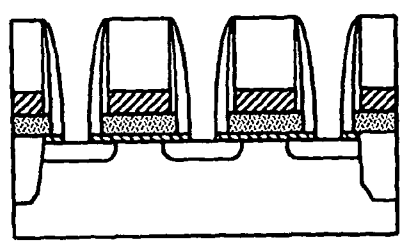

The dry etching method was then used with the stack E, on which the sidewall insulation film 27 was formed, as the mask to remove the gate insulation film 22 by the etching to expose the substrate 21 surface (FIG. 2(F)).

Figure 3A:
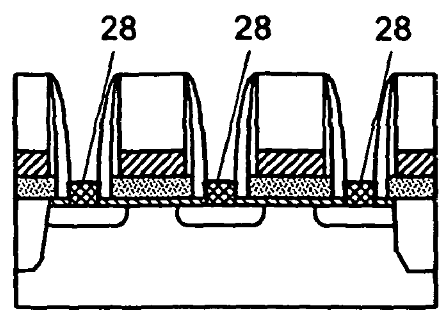
FIGS. 3(A) to 3(D) are schematic cross sectional views of the steps illustrating the manufacture example of the DRAM semiconductor memory as the embodiment of the present invention.

Then, the selective epitaxial growth method was used for the exposed substrate surface to grow the silicon layer 28 with the thickness of 40 nm on the exposed surface of other than the device isolation region 4 (FIG. 3(A)).

The selective epitaxial growth can be performed after removing the native oxide film on the exposed surface of the silicon substrate under the temperature of 750 to 900° C. and the pressure of $1.3\times10^2$ to $1.3\times10^4$ Pa (1 to 100 Torr) using the mixed gas of dichlorosilane ($SiH_2Cl_2$) and hydrogen chloride (HCl) as the source gas in a hydrogen flow, for example.

Figure 3B:
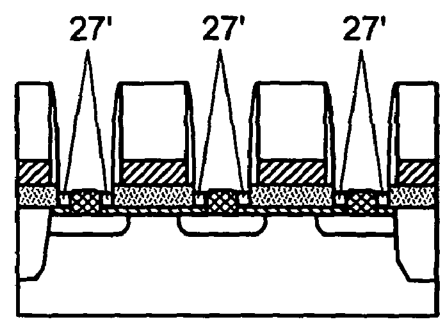

Thereafter, the sidewall insulation film 27 was isotropically etched for 5 minutes using diluted fluoric acid solution of fluoric acid (55%) and pure water mixed at 1:100 to be processed so that it remains as the gap insulation film 27' in the gap between the polysilicon film 23 of the gate electrode and the silicon layer 28 (FIG. 3(B)). At this time, although the sidewall insulation film 27 is substantially removed on the device isolation region 4 side where the silicon layer 28 is not formed, the gap isolation film 27' can remain selectively on the diffusion layer side where the silicon layer 28 is formed because it is etched only from the top surface due to the presence of the silicon layer 28. In other words, the height of the gap insulation film 27' is determined by the thickness of the silicon oxynitride film (the sidewall insulation film 27) and the height of the silicon layer 28.

Figure 5:
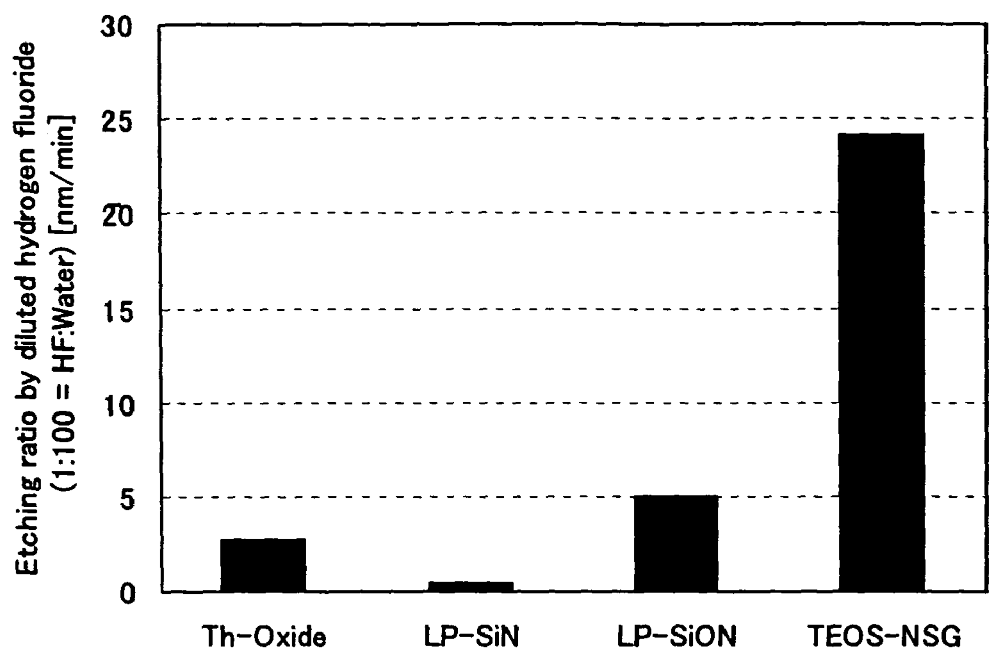
FIG. 5 illustrates etch rates of various insulation films for diluted fluoric acid solution.

Here, since the silicon oxynitride film (LP-SiON) formed by the low pressure CVD method has the rapid etch rate for the diluted fluoric acid (fluoric acid: water=1:100) as compared with that of the silicon nitride film (LP-SiN) formed by the low pressure CVD method, as illustrated in FIG. 5, the silicon oxynitride film can be selectively removed while remaining the first sidewall silicon nitride film 26. The silicon oxide film (TEOS-NSG film) formed by the low pressure CVD method has the still rapid etch rate. As described, the silicon oxide film formed by the low pressure CVD method has the etch rate more rapid than that of the LP-SiON. From the above, it is obvious that selective removal can be carried out using the silicon oxide film instead of the silicon oxynitride film.

As the diluted fluoric acid solution, the mixing ratio of fluoric acid (55%) and water (pure water) of 1:50 to 1:500 is preferred. Although it becomes difficult to retain an etching selection ratio with the silicon nitride film as the ratio of fluoric acid increases, it may be readily retained at fluoric acid: water=1:50 or more. In contrast, although etching time becomes longer and the etching becomes less efficient as the ratio of fluoric acid decreases too much, industrially advantageous etching time can be achieved at fluoric acid: water=1:500 or less.

Figure 6:
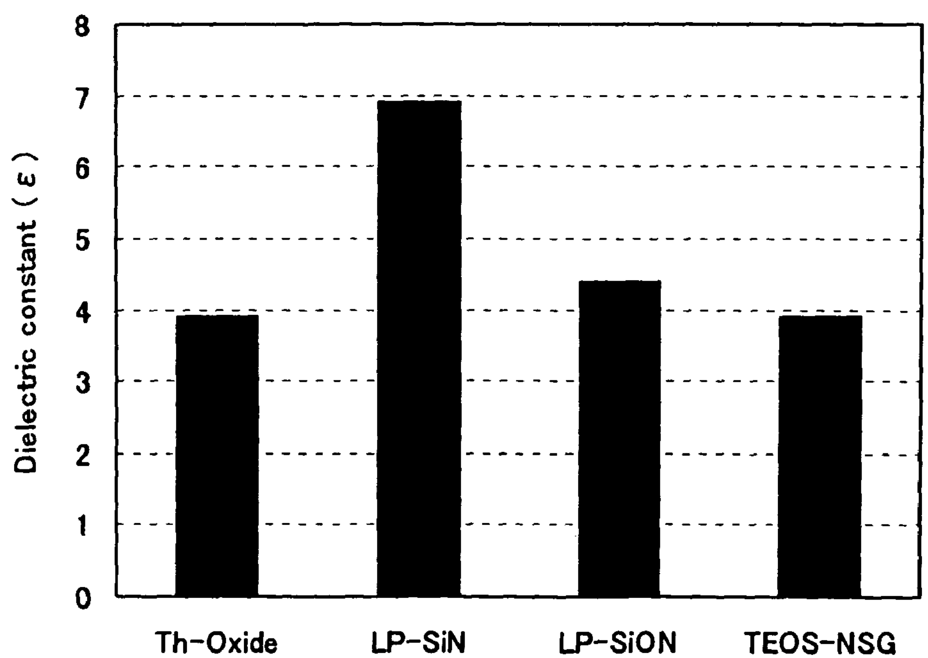
FIG. 6 illustrates relative dielectric constants of the various insulation films.
Figure 7A:
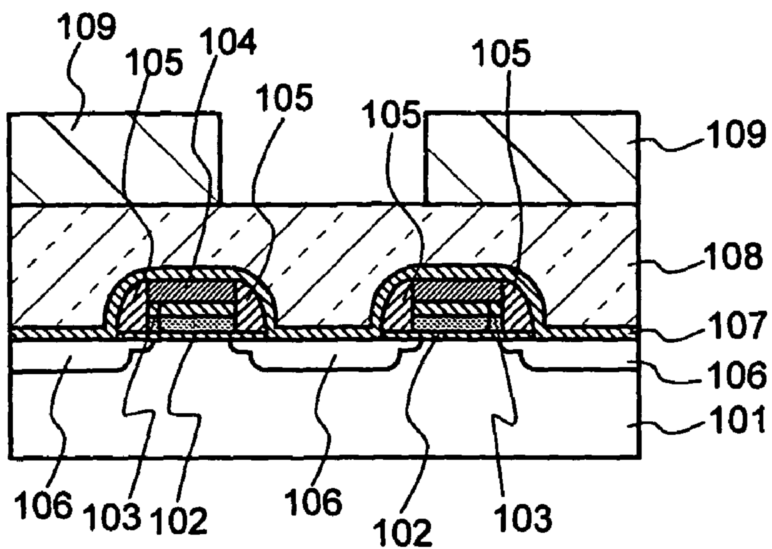
FIGS. 7(A) to 7(C) are schematic cross sectional views of the steps of the first conventional art.
Figure 7B:
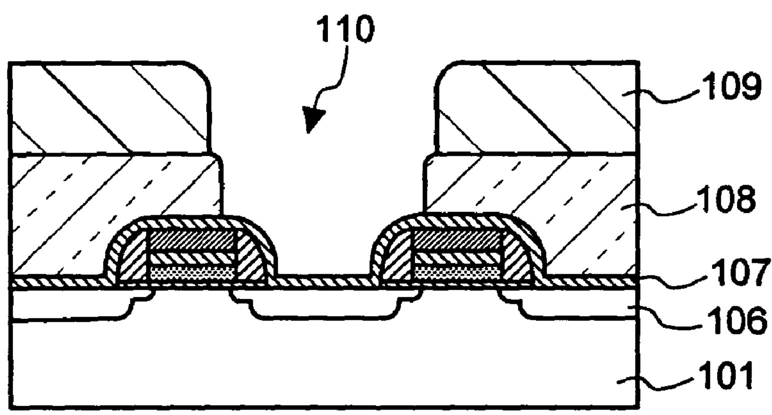
Figure 7C:
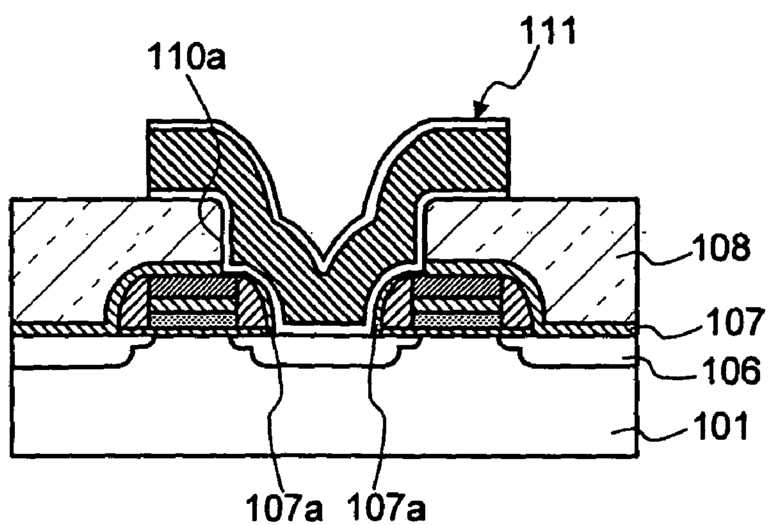
Figure 8A:
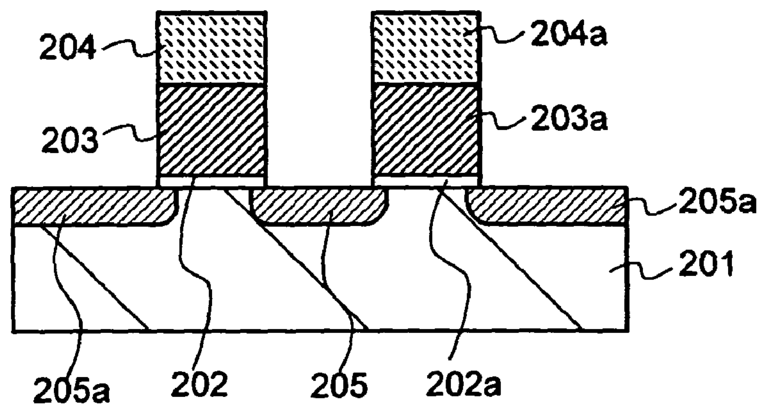
FIGS. 8(A) to 8(C) are schematic cross sectional views of the steps of the second conventional art.
Figure 8B:
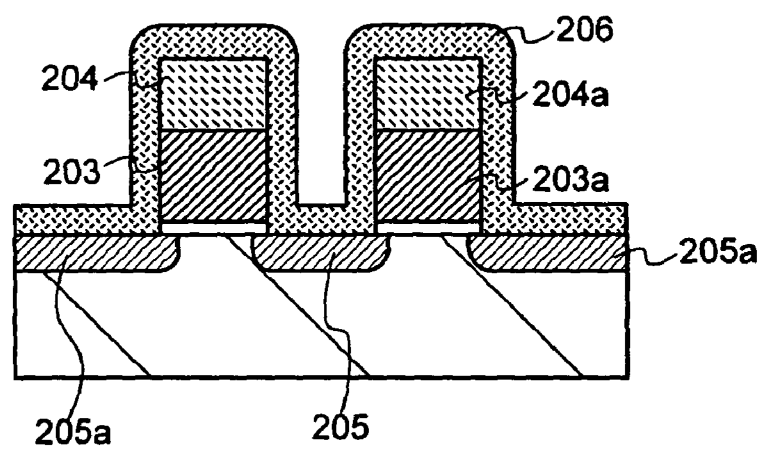
Figure 8C:
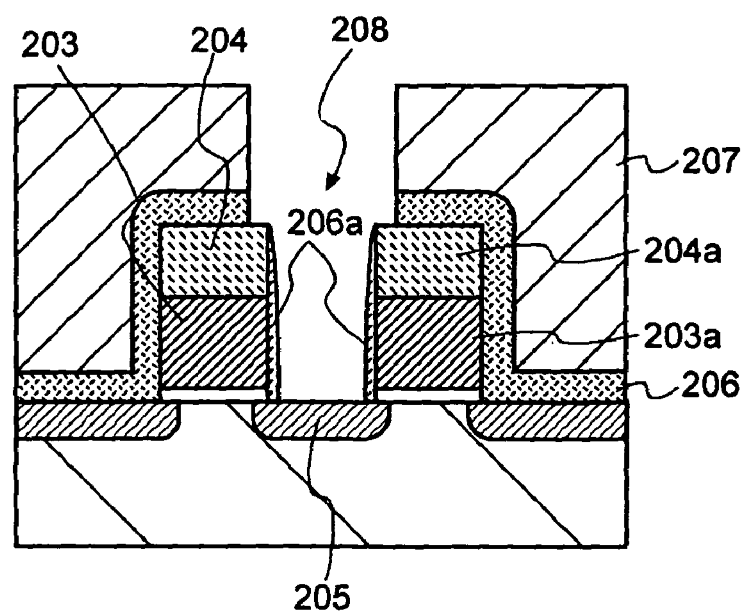
Figure 9A:
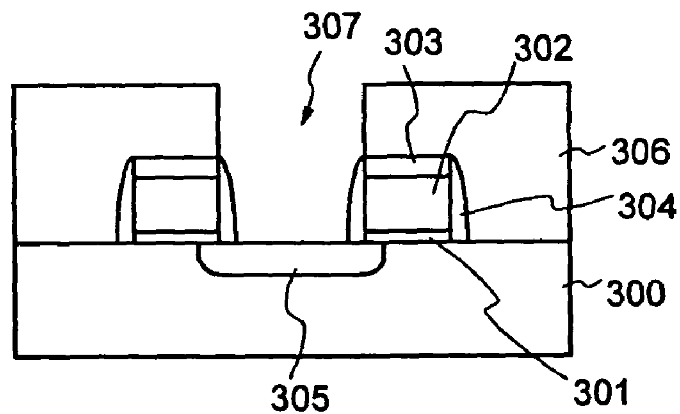
FIGS. 9(A) to 9(D) are schematic cross sectional views of the steps of the third conventional art.
Figure 9B:
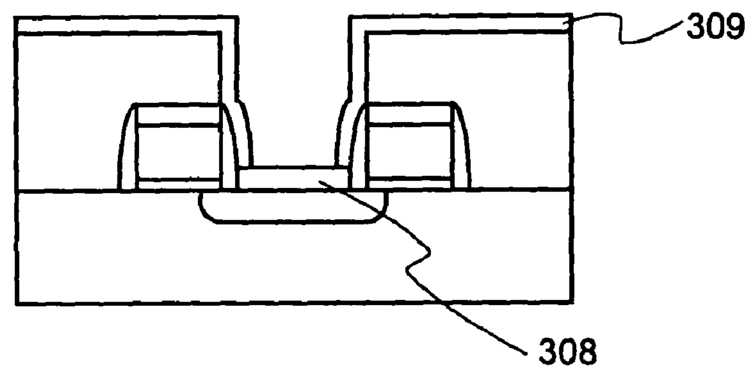
Figure 9C:
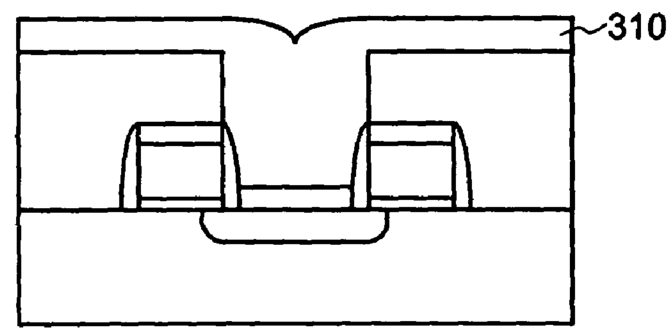
Figure 9D:
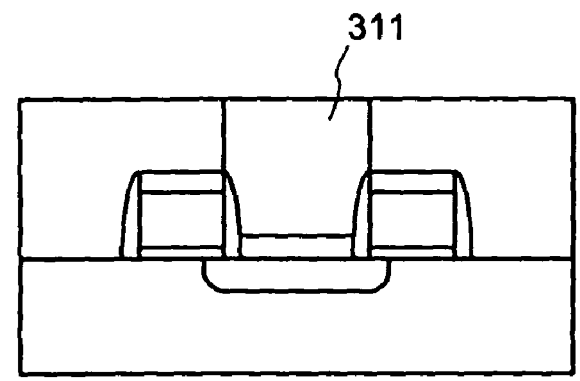
Figure 10A:
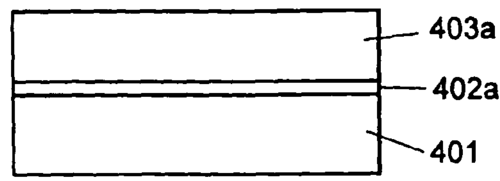
FIGS. 10(A) to 10(G) are schematic cross sectional views of the steps of the fourth conventional art.
Figure 10E:
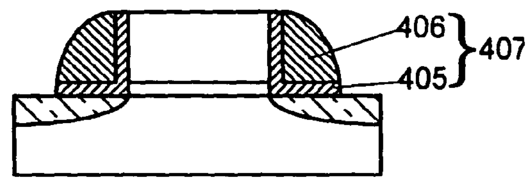
Figure 10B:
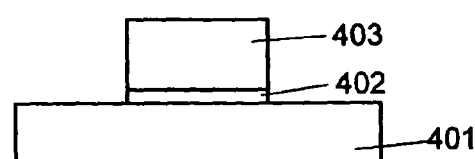
Figure 10F:
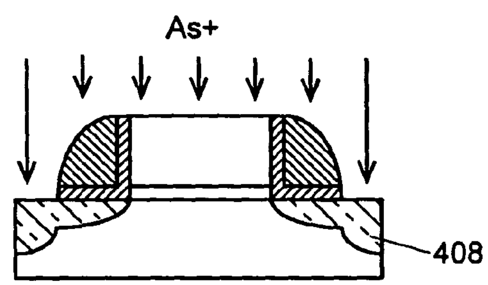
Figure 10C:
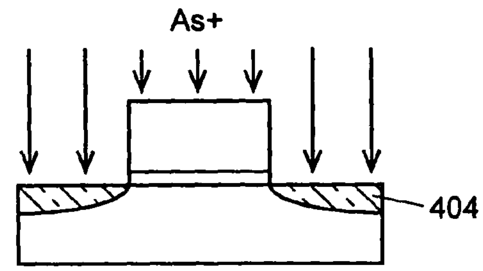
Figure 10G:
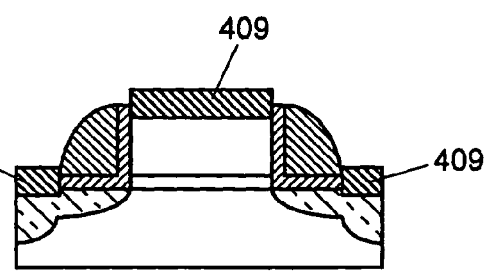
Figure 10D:
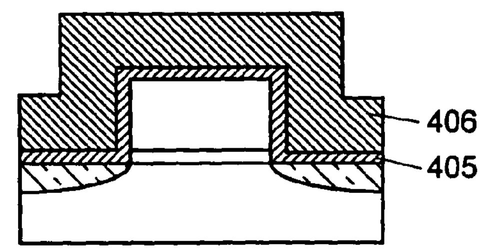

Moreover, a Th-Oxide film, the LP-SiON film, and the TEOS-NSG film have low dielectric constants compared with the LP-SiN as illustrated in FIG. 6. For this reason, if the gap between the silicon layer 28 accumulated by the selective epitaxial growth method and the gate electrode is identical in size, parasitic capacitance formed between the silicon layer 28 and the gate electrode can be decreased in the case using the silicon oxynitride film or the silicon oxide film (TEOS-NSG film) as the insulation film for filling the gap as compared with the case using the silicon nitride film. As a result, the capacitance between the bit line and the word line becomes small, resulting in reading operation of the memory being stabilized. Conversely, if the parasitic capacitance is identical, the size of the gap can be decreased in the case using the silicon oxynitride film or the silicon oxide film (TEOS-NSG film) as compared with the case using the silicon nitride film. As a result, the wide contact area can be retained, leading to the effect that the contact resistance can be suppressed low.

Figure 3C:
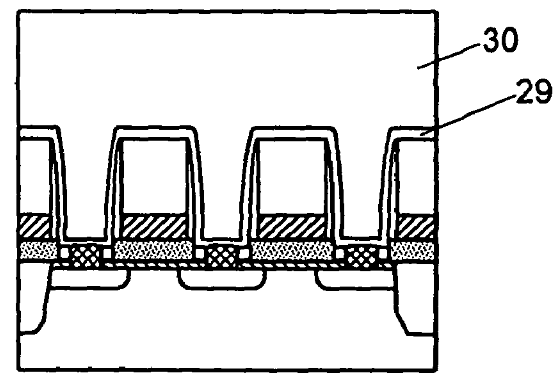
Figure 3D:
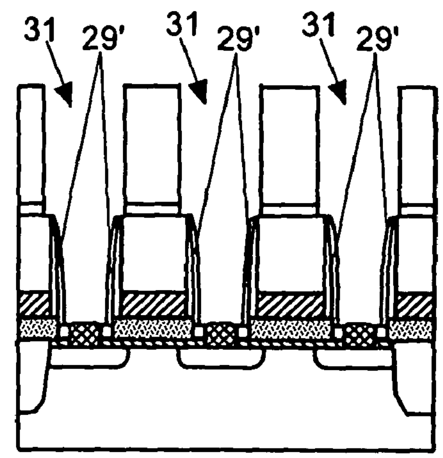

Next, the third silicon nitride film 29 with the thickness of 5 nm and the interlayer insulation film 30 composed of the silicon oxide film with the thickness of 350 nm were formed, and the interlayer insulation film 30 was planarized by the CMP method (FIG. 3(C)).

An antireflection film and a photosensitive resist (not shown) were applied on the interlayer insulation film 30 to form the contact pattern by the lithography technology. The dry etching was applied to the interlayer insulation film 30 under the condition that the selection ratio was high to the third silicon nitride film 29 using the contact pattern as the mask to form an aperture which was to be the self-aligned contact. The third silicon nitride film which was exposed to the aperture was etched back to form the contact hole 31 which exposed the silicon layer 28 and the photosensitive resist and the antireflection film were removed (FIG. 3(D)). At this time, the contact hole 31 exposure side of the third silicon nitride film 29 is etched back and remains as the second sidewall silicon nitride film 29' on the sidewall of the gate electrode (in this example, the side face of the first sidewall silicon nitride film 26 formed on the side face of the stack D of the metal film 24 and the first silicon nitride film 25).

A contact is completed by burying a conductive material used as the contact plug, e.g., the doped polysilicon, in the contact hole 31 (not shown). Alternatively, as illustrated in FIG. 4, it can be completed by forming a fourth silicon nitride film with the thickness of 5 nm after forming the contact hole 31, removing the fourth silicon nitride film on other than the sidewall of the contact hole 31, forming the contact side protection silicon nitride film 32, and burying the doped polysilicon 33 used as the contact plug. The contact sidewall protection silicon nitride film 32 is also isolated from the silicon substrate 21 by the gap insulation film 27'.

Thereafter, the DRAM can be formed through the forming of the bit line, a capacitance portion, and an upper wiring layer.

What is claimed is:

1. A semiconductor integrated circuit device comprising:

a diffusion region selectively formed in a semiconductor substrate to define a channel region;

a gate electrode structure disposed over the channel region with an intervention of a gate insulating film therebetween, the gate insulating film comprising an extended portion extending from an edge of the gate electrode structure toward the diffusion region;

a silicon layer disposed on the diffusion region and including a contact surface contacting an edge of the extended portion of the gate insulating film;

a first insulating film formed on a substantially entire upper surface of the extended portion of the gate insulating film, the first insulating film having a thickness which is less than a thickness of the silicon layer at the contact surface of the silicon layer; and a second insulating film disposed on the first insulating film and elongated over a side surface of the gate electrode structure, the second insulating film being different in material from the first insulating film, and the first insulating film being sandwiched between the second insulating film and the extended portion of the gate insulating film.

2. The semiconductor integrated circuit device according to claim 1, wherein the gate electrode structure comprises a polysilicon layer on the gate insulating film and a metal layer on the polysilicon layer, the first insulating film being formed in contact with a part of an edge of the polysilicon layer apart from the metal layer, and the side surface of the gate electrode structure includes a remaining part of the edge of the polysilicon layer and a side surface of the metal layer.

3. The semiconductor integrated circuit device according to claim 1, wherein the first insulating film comprises at least one of a silicon oxide film and a silicon oxynitride film, and the second insulating film comprises a silicon nitride film.

4. The semiconductor integrated circuit device according to claim 3, further comprising a third insulating film between the second insulating film and the side surface of the gate electrode structure, the third insulating film comprising a silicon nitride film.

5. The semiconductor integrated circuit device according to claim 1, further comprising a contact plug formed in contact with the silicon layer and the second insulating film.

6. The semiconductor integrated circuit device according to claim 2, wherein the gate electrode structure further comprises a fourth insulating film being formed on the metal layer.

7. The semiconductor integrated circuit device according to claim 6, wherein the fourth insulating film comprises a silicon nitride film.

8. The semiconductor integrated circuit device according to claim 2, wherein the metal layer comprises a first metal layer and a second metal layer on the first metal layer, the first metal layer comprising at least one of a metal nitride film and a metal silicide film.

9. The semiconductor integrated circuit device according to claim 1, further comprising:

a contact plug formed in contact with the silicon layer; and a fifth insulating film disposed between the contact plug and the second insulating film.

10. The semiconductor integrated circuit device according to claim 9, wherein the fifth insulating film comprises a silicon nitride film.

11. The semiconductor integrated circuit device according to claim 1, wherein the gate electrode structure comprises a polysilicon layer formed on the gate insulating film, the first and second insulating films contacting a side surface of the polysilicon layer and the second insulating film contacting an upper surface of the first insulating film.

12. The semiconductor integrated circuit device according to claim 1, wherein the silicon layer has a thickness which is greater than a combined thickness of the first insulating film and the extended portion of the gate insulating film.

13. The semiconductor integrated circuit device according to claim 1, further comprising:

a third insulating film formed between the second insulating film and the side surface of the gate electrode structure, wherein the gate electrode structure comprises:

a polysilicon layer formed on the gate insulating film;

a metal layer formed on the polysilicon layer; and a fourth insulating film formed on an upper surface of the metal layer, and wherein the third insulating film is formed on an upper surface of the polysilicon film and on a side surface of metal layer and the fourth insulating film.

14. The semiconductor integrated circuit device according to claim 13, further comprising:

a fifth insulating film formed on a portion of the second insulating film and on an upper surface of the first insulating film; and a contact plug formed in contact with the silicon layer and a remaining portion of the second insulating film.

15. A semiconductor device comprising:

a diffusion region formed in a semiconductor substrate to define a channel region;

a gate insulating film formed on the channel region;

a gate electrode structure formed on the gate insulating film and comprising a polysilicon layer formed on the gate insulating film, the gate insulating film comprising an extended portion extending from an edge of the polysilicon film toward the diffusion region;

a first insulating film formed on a substantially entire surface of the extended portion of the gate insulating film and contacting a side surface of the polysilicon layer;

a silicon layer disposed on the diffusion region and including a contact surface contacting an edge of the extended portion of the gate insulating film and a side surface of the first insulating film, the silicon layer having a thickness which is greater than a thickness of the first insulating film at the contact surface of the silicon layer; and a second insulating film disposed on the first insulating film and contacting the side surface of the polysilicon layer and elongated over a side surface of the gate electrode structure, the second insulating film being different in material from the first insulating film and being separated from the extended portion of the gate insulating film by the first insulating film.

16. The semiconductor device of claim 15, further comprising:

a third insulating film formed on an upper surface of the polysilicon film;

a fifth insulating film formed on a portion of the second insulating film and on an upper surface of the first insulating film; and a contact plug formed in contact with the silicon layer and a remaining portion of the second insulating film, wherein the gate electrode structure further comprises a metal layer formed on the polysilicon layer, and a fourth insulating film formed on an upper surface of the metal layer, and wherein the third insulating film is formed on a side surface of the metal layer and on the fourth insulating film, and separates the second insulating film from the side surface of metal layer.

* * * * *